United States Patent [19]

Fremgen et al.

[11] Patent Number: 4,738,633

[45] Date of Patent: Apr. 19, 1988

[54] DEVICE FOR MAKING AN ELECTRICALLY CONDUCTIVE CONTACT TO AN INSULATED CABLE LEAD

[75] Inventors: Dieter Fremgen, Wuelfrath; Heinz Penz, Hagen; Georg Reitmeyer, Iserlohn; Rolf-Udo Weber, Muehlheim, all of Fed. Rep. of Germany

[73] Assignee: Walter Rose GmbH & Co., KG, Fed. Rep. of Germany

[21] Appl. No.: 862,066

[22] Filed: May 12, 1986

[30] Foreign Application Priority Data

Apr. 15, 1985 [DE] Fed. Rep. of Germany ....... 3513595

[51] Int. Cl.⁴ .............................................. H01R 4/24
[52] U.S. Cl. .................................... 439/436; 439/490
[58] Field of Search .............. 339/97 R, 97 P, 97 T, 339/58 R, 99 R; 324/72.5, 96, 217 S; 439/389, 391, 436–441, 488–490

[56] References Cited

U.S. PATENT DOCUMENTS

| 953,678 | 3/1910 | Luther et al. | 339/97 T |
|---|---|---|---|
| 2,445,667 | 7/1948 | Fuglie | 339/97 T X |
| 2,569,972 | 10/1951 | Benner et al. | 173/273 |
| 2,714,196 | 7/1955 | Melehan | 339/97 T |
| 2,805,399 | 9/1957 | Leeper | 339/97 P |
| 3,864,629 | 2/1975 | Danna | 339/97 T X |
| 3,996,511 | 12/1976 | Baer | 339/97 T |
| 4,057,313 | 11/1977 | Polizzano | 339/97 T X |
| 4,437,722 | 3/1984 | Bianchi | 339/97 P |

*Primary Examiner*—John McQuade
*Attorney, Agent, or Firm*—Herbert G. Burkard

[57] ABSTRACT

A device for making an electrically conductive contact to an insulated cable lead, comprising a holder for the cable lead which is to be contacted, and an electrically conductive perforation needle for penetrating the insulating jacket of the lead. In a preferred embodiment an indicator unit shows when successful contact has been made. The device allows contact to be made to an existing cable lead without cutting that cable lead. It also causes minimal damage to the insulation of the existing cable.

16 Claims, 7 Drawing Sheets

FIG_1

FIG_2

FIG_3

FIG_4

FIG_5

FIG_6

FIG_7

DEVICE FOR MAKING AN ELECTRICALLY CONDUCTIVE CONTACT TO AN INSULATED CABLE LEAD

BACKGROUND OF THE INVENTION

1. Field of the Invention

This invention relates to a device for making an electrically conductive contact to an insulated cable lead.

2. Introduction to the Invention

There are a number of applications in which electrical connections have to be made, to and with insulated cable leads. For example cable connections, new wiring, branches or the like may be required to the lead. During the formation of these connections it is often necessary to maintain electrical continuity in the existing cable lead while the new connection is being made. In these applications any existing electrical connection must not be disturbed during the course of making the new connection. One important application is connections to communications cables. For example, a so called junction splice may be made to a communications cable, that is to say a lead of newly installed cable may be connected to an existing lead. During the connection of the new lead the electrical continuity of the existing lead must be maintained.

It is an object of the invention to provide a device with which contact of leads may be made reliably and without problem, which additionally provides the possibility of testing the contact made and with which all the essential leads in the cable (different types of lead and insulation occur in the preferred application of communications technology) can be contacted irrespective of the type of insulation of the cables used. It is also an object that electrical connection can be carried out in such a manner that damage to the insulating jacket is substantially avoided or is so negligible that, after removing the connection, a short circuit between adjacent cable leads is reliably prevented.

BRIEF DESCRIPTION OF THE DRAWINGS

The invention is illustrated, by way of example, with reference to the drawings, wherein.

SUMMARY OF THE INVENTION

The present invention provides a device for making an electrically conductive contact to one or more insulated cable leads, comprising (a) a holder for the or each of the cable leads which is to be contacted and (b) an electrically conductive perforation needle for the or each of the cable leads which is to be contacted, for penetrating the insulating jacket of the or each of the leads.

DETAILED DESCRIPTION OF THE INVENTION

There are many advantages associated with the invention. The holder for contacting the cables ensures that it is held securely, and the electrically conductive perforation needle can be conveniently arranged to cause negligible damage to the insulating jacket whether it be, for example, a paper insulation or a plastics insulation or the like. The perforation needle advantageously has a fine point which pierces the fine insulation and makes a reliable contact and, after being removed, leaves behind an area of the insulation that is so neglibibly damaged that short-circuits between adjacent cable leads are reliably avoided even when the device had been applied to them successively.

In a preferred embodiment, the invention provides for the perforation needle to be loaded by a spring in the direction of penetration into the insulating jacket of the cable lead or leads.

The device is advantageously constructed so that the pressing force of the contacting perforation needle can be pre-determined at the factory and hence adapted to the particular application. Thus, the pressing force can be adjustable, for example, to three Newtons, this being done by selecting an appropriate compression spring. This force is then guaranteed time after time in each further contacting operation.

It is advantageous if the perforation needle is guided in a housing. The housing is preferably elongate. Preferably one end of the housing is equipped with the holder for the cable lead. If the perforation needle and the holder for the cable lead are integrated into a common housing, it is possible to achieve with simple means a very firm electrical connection and therewith reliable electrical contact. The construction of the holder, for example in the form of a holding prism, makes it possible to contact cable of different diameters with the same device because the inserted cable leads are centered by the prism guide irrespective of the magnitude of their diameters.

The field of communication cables is of particular interest to the present invention. As a rule communications cables consist of a plurality of relatively tightly packed cable leads. For this application in particular, the outer free end of the housing is preferably conical or pyramid-shaped in the region of the holder. This shaping facilitates insertion between the relatively tightly packed cable leads. The user can then employ the free end of the device in the manner of a driving point as a tool for entering between the cable leads.

Preferably the perforation needle can be withdrawn from the region of the holder. In this case it is advantageous, in order to apply the pressing force, (which is preferably applied by the above described spring which is preferably included), if the perforation needle is surrounded by a substantially hollow cylindrical pressing element. The pressing element is preferably displaceably arranged in the housing.

The pressing element (if present) holds the inserted cable lead in the holder. The pressing element is preferably loaded by a further spring in the direction of pressing onto the cable lead. This makes it possible, for example, for the same pressing force of the pressing element to be applied for holding the device onto the corresponding cable lead.

Where one or more perforation needles and also pressing elements are included, the perforation needle or needles and the pressing element or elements are preferably guided in the housing in such a manner that, upon releasing these parts of the device in the direction of the particular inserted cable lead, first the respective pressing element and thereafter the perforation needle or the perforation needles are moved in the direction of forward thrust.

It may be mentioned at this point that this construction may be applied in the same manner to a device having more than one perforation needle as is described, for example, hereinafter. As a result of the shaping of the device indicated above and the sequence of movements, the respective cable lead is fixed in the holder first and only thereafter is the insulation penetrated. This results not only in the avoidance of faulty contacting but also in the avoidance of damage to the cable leads, which are usually arranged obliquely in the holders.

To facilitate handling, a further contruction provides for the housing to be equipped, at the end remote from the free end, with a stationary, central pressure rod on which there is displaceably guided inside the housing a return grip. To the shaft of the return grip, which is guided centrally in the housing, the perforation needle is operationally connected.

In an additional contruction, an indicator unit, preferably a light-emitting diode is included in the device. This is preferably arranged on the return grip (when present). The indicator unit indicates that contact between the perforation needle and the conductor of the cable lead has taken place.

It is important for the user to be able to recognise whether, after applying the device, the perforation needle has actually achieved a contact with the cable lead, that is to say with the conductor of the cable lead. The arrangement can be such that, immediately after the perforation needle has pierced the plastics or paper insulation and come into contact with the conductor of the lead, the light-emitting diode (or other indicator) lights up and thus indicates to the user that the contact has been made.

The device preferably comprises a contact cable which is in electrical contact with the perforation needle and extends outward of the housing. This allows the contact lead which is in the holder of the device and contacted by the perforation needle, to be electrically connected to another conductor. For example the contact cable may be connected, by a second device according to the invention, to another cable lead.

For some applications it is desirable to bridge cable leads that can be reached in pairs and/or to connect two cable leads to further conductors using a single device. For this application, the invention makes provision, in a further construction, for at least two pressing elements, two holders and two perforation needles to be arranged inside a common housing.

According to one construction in this variant, provision is made for the two holders for the two cable leads to be offset one behind the other in the longitudinal direction of the housing. This offset arrangement facilitates the insertion of the device into bunches of cable leads, particularly since it is not necessary to apply the total separating force between adjacent cables at the two points equally. It is possible for the device to enter first at one point and then at the other.

The invention also provides for the two pressing elements to be loaded by two compression springs which are assigned individually, whilst the two perforation needles are acted upon by a spring which loads a common pressure rod. This arrangement can, of course, also be such that each perforation needle is equipped with an individual compression spring. However, the combination arrangement permits more economical manufacture.

In order to render the operation of the device simpler and more reliable while providing, at the same time, a shorter design of the entire device and a more advantageous arrangement of the contact cable, the construction of the invention makes provision in a further variant for the housing to be provided, at the end thereof remote from the holder, with radially compressible parts the actuation of which effects axial displacement of a plunger carrying the perforation needle and of the pressing element surrounding the plunger in the direction of the cable lead which is to be acted upon. This construction prevents undesirable forces from being exerted in the axial direction of the device, when operated on the cable lead lying in the holder of the device or on the other cable leads of the cable in question which are contacted by the housing point. This might occur, for example, if the loom of cables or the cable lead were unintentionally pulled upwards. Furthermore, it is no longer necessary for the contact cable which is connected to the perforation point in an electrically conductive manner, to be guided out of the device at the side, which, in many cases, is unfavorable for reasons of space and, in addition, entails the risk of damage to, or breaking of, the contact cable after a certain period of use.

An especially simple construction is obtained if the radially compressible parts are formed by two clamping jaws arranged diametrically on the housing and having conical clamping faces which cooperate with corresponding conical faces on the plunger to effect axial displacement of the latter.

As will be apparent, as a result of such a construction, the device can be actuated by simply pressing together the radially compressible parts, preferably diametrically arranged clamping jaws, by means of the thumb and index finger, the actuating forces being applied in the radial direction so that there is no risk of axial displacement and its associated danger of damage to the cable leads cooperating with the device.

As a development of this variant according to the invention, the plunger which is connected to the perforation needle, and arranged slidably with respect to the pressing element, can then be provided with an axially extending connection for a contact cable, i.e. the contact cable can extend in the axial direction away from the device, so that right-angled bending and consequent risk of damage to the contact cable are avoided and, in addition, the contact cable is guided in a space-saving manner. As a result of replacing the pressure rod and the return grip by the radially compressible parts the device according to the invention also becomes considerably shorter because there are no longer any axial displacement paths between the aforementioned parts.

The shortening of the entire device can be still further assisted by providing the plunger with a cylindrical sleeve between which, and the central part of the plunger, the pressing element is arranged so as to be axially displaceable within limits.

As a further development, a helical compression spring can be arranged between an annular shoulder of the housing and an outwardly pointing annular shoulder of the cylindrical sleeve, and a further spring, constructed as a helical compression spring, can be arranged between an annular shoulder of the plunger and an annular shoulder of the pressing element.

Finally, it is especially advantageous in the contruction of the variant according to the invention if a third spring is arranged between the plunger and perforation needle, which spring exerts on the cable lead which is to be contacted a perforation force that is dependent only on its strength. This ensures that pressing and fixing of the cable lead with a pressing force which is always constant and which depends only on the strength of the second spring is effected first. Subsequently, i.e. after the cable lead has been fixed by the pressing element, the perforation force exerted on the insulation of the cable lead, irrespective of the thickness of the particular cable lead, is dependent only on the spring characteristic of the third spring.

DETAILED DESCRIPTION OF THE DRAWINGS

Figure 1:
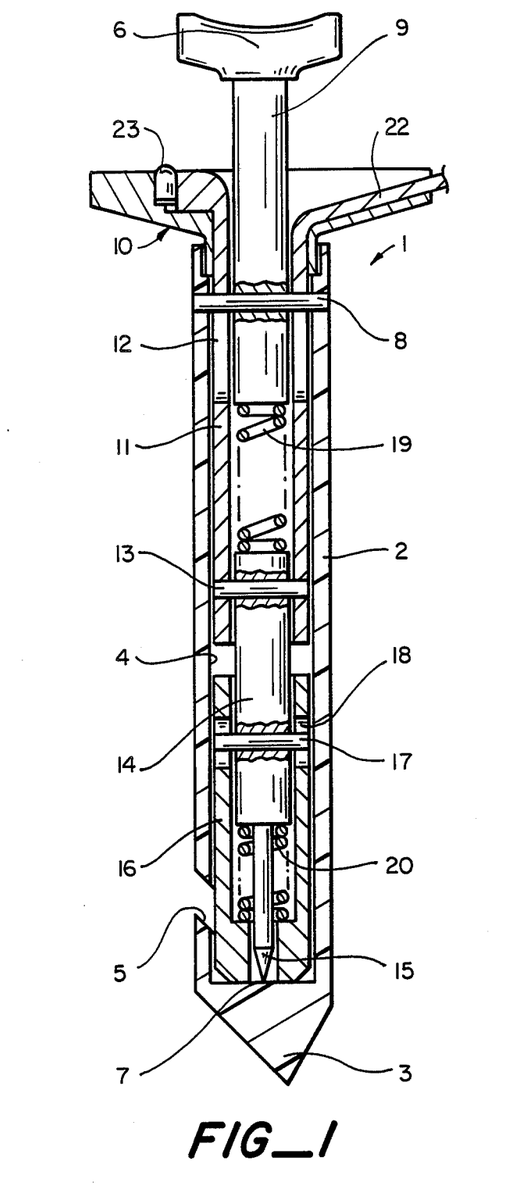
FIGS. 1 to 3 show an exemplary embodiment of the invention, in section in each case, in different operating positions.
Figure 2:
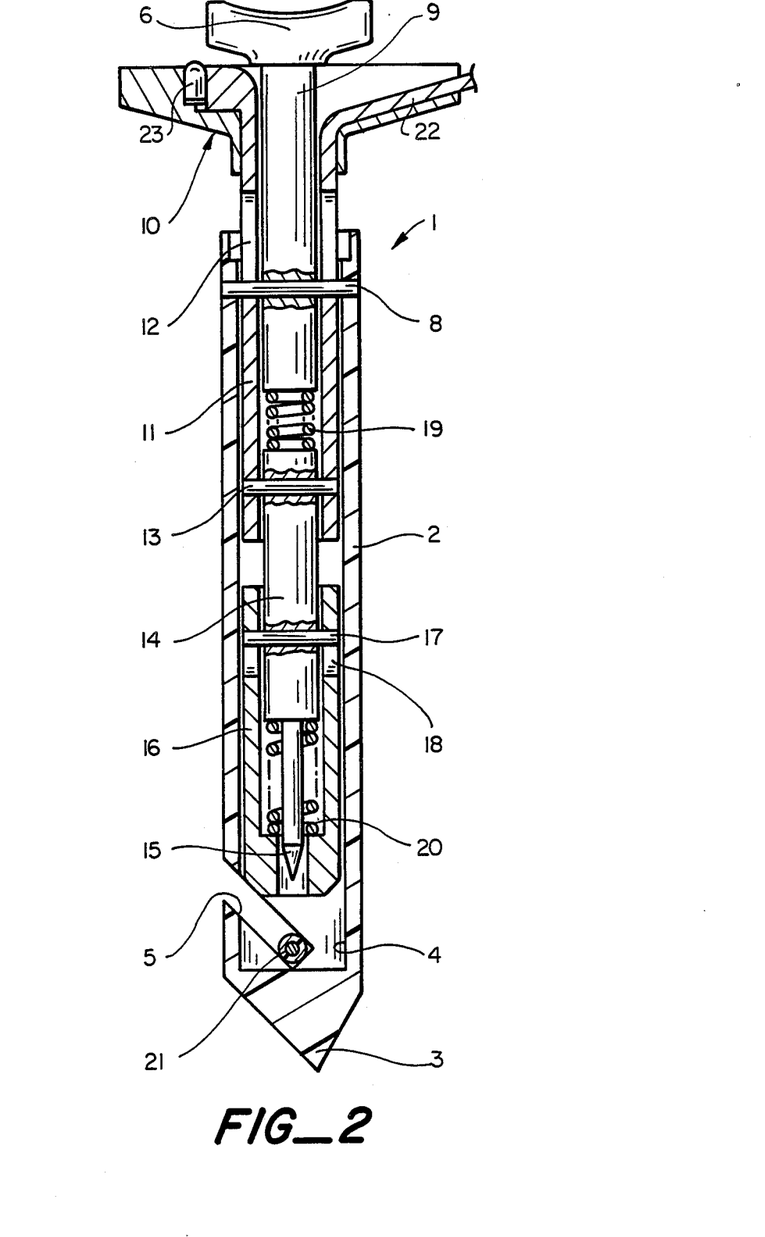
Figure 3:
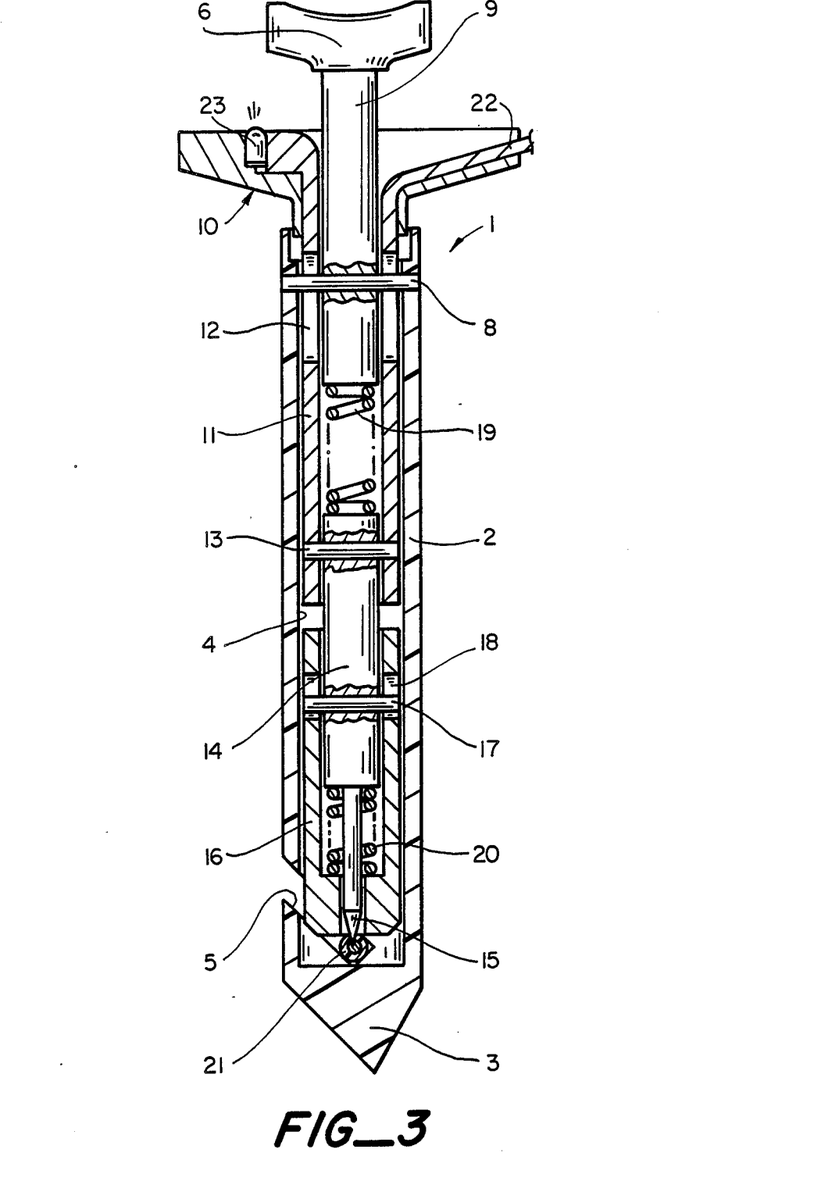
Figure 4:
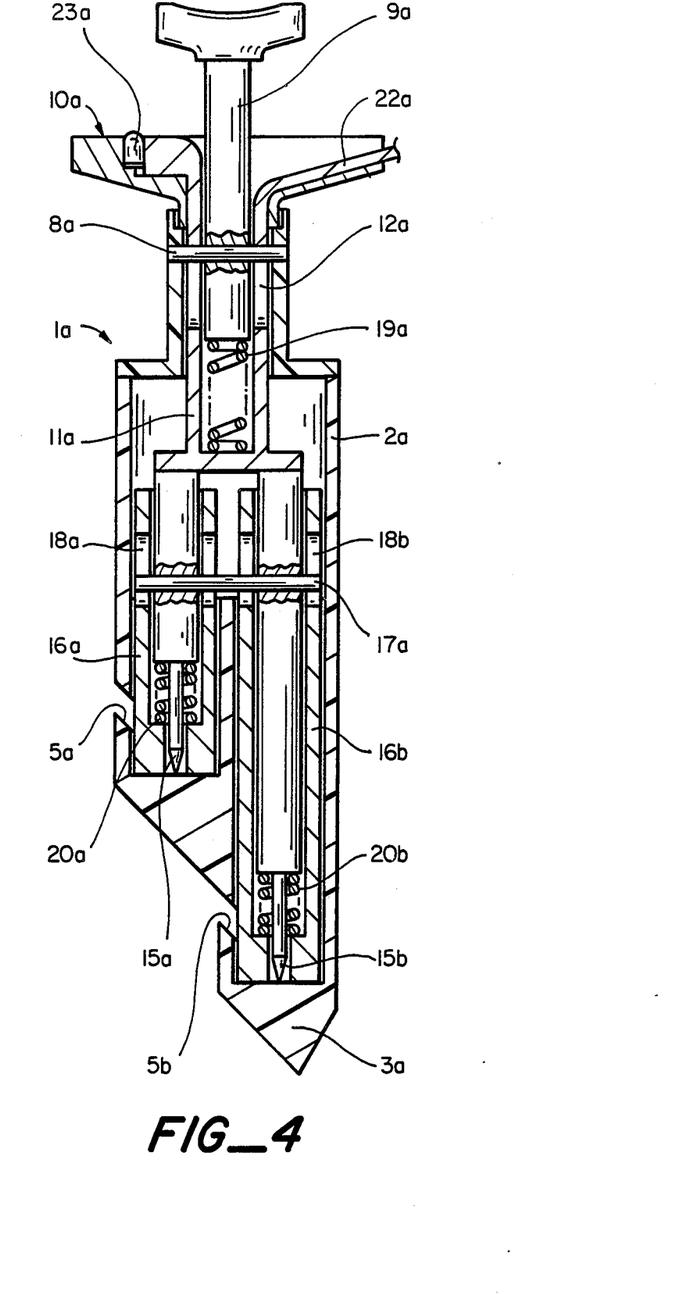
FIG. 4 shows a modified example of the invention in the same view as FIG. 1.

Whereas in FIGS. 1 to 3, the device is generally designated 1, the device in the modified exemplary embodiment according to FIG. 4 carries the general reference numeral 1a. Otherwise, all the elements in FIG. 4 have the same reference numerals as those in FIG. 1 but with an additional "a" or "b".

As will be seen in FIG. 1, the device 1 has a housing which is of substantially hollow-cylindrical construction. The housing 2 is equipped at one end with a conical point 3. The inner bore ends in the region of the point 3, as does also an oblique slot 5 arranged at the side and inclined towards the point and forming, in the middle axis 6, a prism 7.

At the upper end, remote from the point 3, the housing 2 has a central pressure rod 9 which is held stationary by means of a pin 8.

On the pressure rod 9 and inside the bore 4 of the housing 2 a return grip 10 is guided by means of a hollow-cylindrical shaft 11. The shaft 11 has in the region of the retaining pin 8 a slot guide 12 which allows a return of the return grip from the position shown in FIG. 1 into the position shown in FIG. 2.

The shaft 11 also gas at the end thereof which is guided in the interior of the housing 2 a retaining pin 13 to which is attached a plunger 14 the diameter of which substantially corresponds to that of the pressure rod 6. The lower end of the plunger 14 pointing towards the conical point 3 carries a perforation needle 15 which may optionally be integral or firmly connected therewith.

The plunger 14 and the perforation needle 15 are surrounded by a cylindrical pressing element 16 the end of which towards the conical point 3 is provided in a blind bore with a through-opening for the perforation needle 15. The pressing element 16 has substantially the same diametrical constructions as the shaft 11 of the return grip 10.

At the end towards the return grip, the pressing element 16 is guided on the plunger 14 in slots 18 by means of guide pin 17.

As is apparent from the Figures, there is provided between the stationary lower end of the pressure rod 6 and the upper end of the plunger 14 a spring 19 by means of which the pressing force is applied to the perforation needle 15 which is in operational connection with the plunger 14. At the opposite end of the plunger, the perforation needle 15 is surrounded by a further spring designated 20 which is supported inside the blind bore in the interior of the pressing element 16 at one end and on a shoulder on the plunger 14 at the other end.

The device operates as follows:

If the cable lead, designated 21 in FIGS. 2 and 3, is to be contacted, the device 1 is introduced with the aid of the conical point 3 into a bunch of cable leads (not shown).

Once the cable lead 21 which is to be manipulated has been found, it is inserted into the slot of the device 1 and, by returning the device 1, is brought into the lower end of that slot and into the position shown in FIG. 2. By virtue of the prism-shaped construction, a number of cable leads having different diameters can each be inserted here without obstructing the mode of operation of the device. During this operation, the return grip 10 is drawn back, that is to say it is in the upper position shown in FIG. 2, the plunger 14 also having boon drawn back by means of the pin 13 and the pressing element 16 by means of the pin 17.

Upon this return of the return grip 10, not only is the pressing element 16 drawn back but, in the same manner, also the perforation needle 15. The compression spring 19 for the perforation needle 15 is thereby compressed as can be seen especially clearly from FIG. 2. If the return grip 10 is then released, the elements move towards the cable lead 21, the force of the compression springs 19 and 20 and the distances to be travelled via the slot guides 12 and 18 being so selected that first the pressing clement 16 comes to bear on the cable lead 21, as shown in FIG. 3, and then the perforation needle 15 pierces the insulation and forms a contact with the inner conductor.

The perforation needle 15 is electrically connected to a contact wire 22 which is guided out of the top of the device 1. By means of this contact wire 22 the connection with the inserted cable lead 21 is thereby made. Advantageously, a device according to the invention is similarly arranged at the other end of the contact wire 22 with which device electrical connection, for example to another cable lead, is then made.

In order to be able to recognise whether electrical contact has taken place, a light-emitting diode 23 is accommodated in the return grip 10 which lights up when the electrical conductor of the cable lead 21 is contacted, thus making the contacting clear to the user.

As already mentioned at the beginning of the specific description, in the exemplary embodiment shown in FIG. 4, identical components are given the same reference numerals supplemented by an "a" or "b". Only the main differences and changes with respect to the exemplary embodiment shown in FIG. 1 will be mentioned here:

The device 1a is equipped with two insertion slots 5a and 5b into which two cable leads can be inserted. Also provided are two perforation needles 15a, 15b, two pressing element 16a, 16b, but, in the exemplary embodiment, only one pressure rod 9a with a pressing spring 19a. The return grip 10a, the by-pass cable 22a and the light-emitting diode 23a, including the essential shaping of the housing 2a, correspond in principle to the construction shown in FIG. 1 and the mode of operation is the same.

By returning the corresponding grip 10a both the pressing elements 16a, 16b and the perforation needles 15a, 15b are lifted out of the insertion slots 5a and 5b, the cable leads can be inserted and, after releasing the return grip 10a, the leads are then held and the perforation needles are able to penetrate the insulation.

Figure 5:
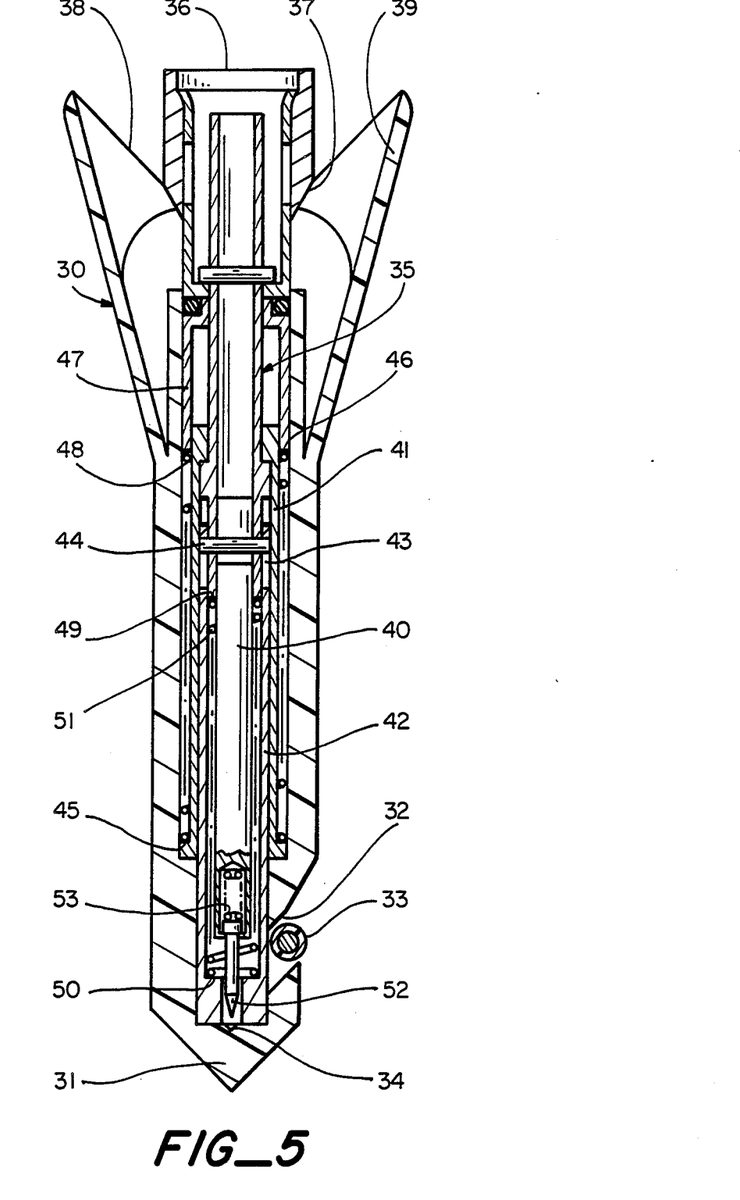
FIG. 5 shows a longitudinal section of a variant according to the invention of the device in the unactuated position.
Figure 6:
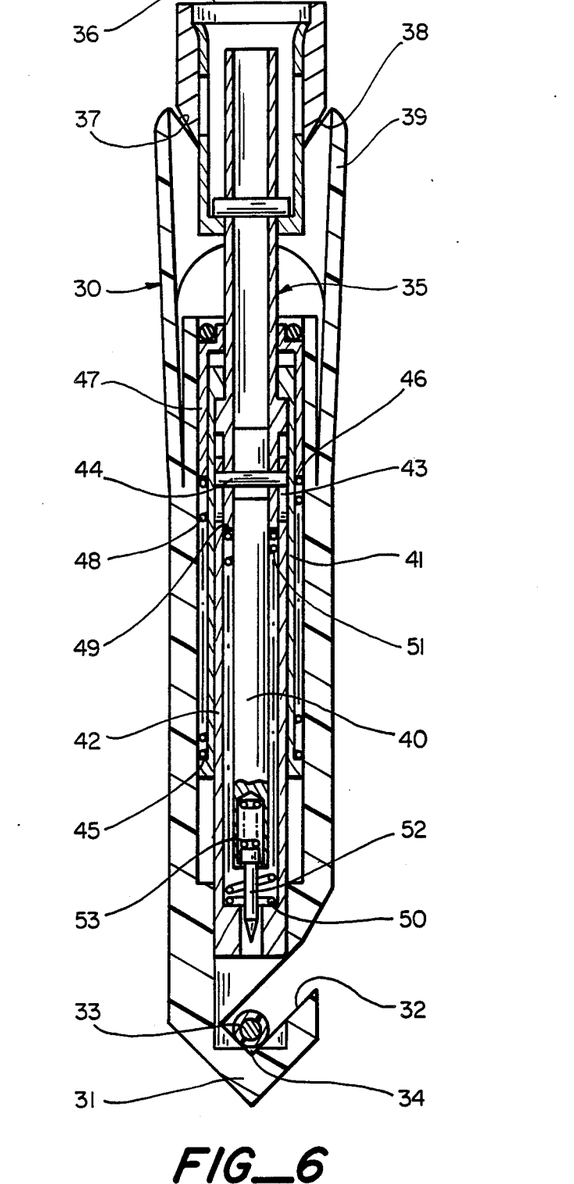
FIG. 6 shows the device according to FIG. 5 with the pressing element and perforation needle drawn back and a cable lead already in the holder of the device.
Figure 7:
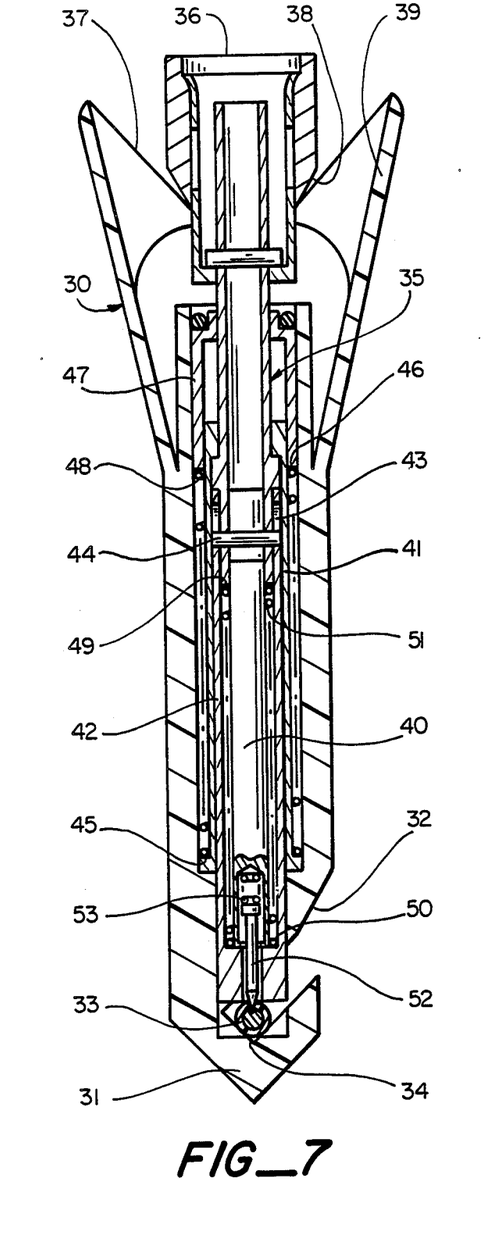
FIG. 7 shows the device according to FIG. 5 in the actuated position, i.e. with the pressing element pressing against the cable lead and with the perforation needle stuck into the cable jacket of the cable lead.

The variant of the invention shown in FIGS. 5 to 7 shows a device having a hollow-cylindrical housing 30 which has at one end thereof a conical point 31 and also a holder 32 for a cable lead 33 which is to be contacted, the holder being constructed as described above, that is to say having an oblique slot which is inclined towards the point 31 and ends in the longitudinal middle axis of the housing 30 to form a prism 34.

In the housing 30, a blind bore having regions of differing diameter is constructed and in this blind bore there is arranged so as to be axially displaceable a plunger generally designated 35, the end 36 of which remote from the point 31 extends out of the housing 30 and is provided with two diametrically opposed wedge faces 37. Opposite wedge faces 38 of the housing 30 which are provided on two clamping jaws 39 arranged resiliently on the housing 30 cooperates with these wedge faces 37. For reasons of production engineering, the plunger 35 consists of several parts, namely a central part 40 and, spaced therefrom, a cylindrical sleeve 41 between which and the central part 40 a pressing element 42 is axially displaceable within the limits defined by slots 43 in the pressing element and the pin 44 passing through the latter between the central part 40 and the cylindrical sleeve 41.

Between an outwardly pointing annular shoulder 45 of the cylindrical sleeve 41 and an annular shoulder 46 of a sleeve-shaped housing part 47 there is arranged a helical compression spring 48 which loads the entire plunger 35 in the direction towards the point 31, i.e. attempts to press the plunger 35 into the blind bore of the housing 30. Between an annular shoulder 49 of the plunger 35 and an annular shoulder 50 of the pressing element 42 there is arranged a second helical compression spring which attempts to press apart the plunger 35 and pressing element 42 within the limits defined by the cooperating arrangement of slots 43 and pin 44.

In the end of the central part 40 of the plunger 35 towards the point 31 a perforation needle 52 is arranged so as to be axially displaceable against the action of a third helical compression spring 53.

The device operates as follows;

In the unactuated position shown in FIG. 5, the housing is introduced by its conical point 31 into a bunch of cable leads and then a cable lead 33 which is to be manipulated or contacted is introduced into the entrance region of the slot 32 (see FIG. 5). Then, the two housing clamping jaws 39 with the conical faces 38 are radially compressed whereupon, as a result of the cooperation with the conical faces 37 at the upper end 36 of the plunger 35, the plunger is pushed against the action of the spring 48 axially out of the housing, also entraining the pressing element 42 owing to the slot-pin connection 43-44. At the same time, the cable lead 33 inserted into the slot 32 slides to the end of the slot 32 where it is centered by the prism 34 as shown in FIG. 6.

Then, the pressure on the housing clamping jaws 39 with the conical clamping faces 38 is removed which results in the plunger 35 together with the pressing element 42 moving back into the housing 30 under the action of the spring 48, the pressing element 42 coming to rest on the cable lead 33 first thereby fixing it in exactly predetermined position before, as a result of the further sinking of the plunger 35, the perforation needle 52 comes into contact with the insulation of the cable lead 33 and pierces it merely under the pressure action of the third spring 53 with a force that is exactly proportioned by the size of that third spring, until electrical contact is made with the conductive core of the cable lead 33. As will be apparent, because of the described construction, it is possible to construct, in a manner not shown in detail, a connection for a contact cable at the upper end 36 of the plunger 35 such that this contact cable is guided out of the device in the axial direction, for example in order to be connected to another cable lead, preferably using a further device of the kind previously described. It will also be apparent that, upon actuating this modified embodiment of the invention, no axial forces are exerted by the device on the cable lead to be contacted or on by the device on the cable lead to be contacted or on the surrounding cable leads, so that gentle treatment of the cable leads is ensured during manipulation. It will also be apparent that this embodiment is very short overall since the necessary axial displacement paths can be small and since all the parts that are displaceable with respect to each other, including the operating springs, are arranged concentrically with respect to each other.

The described exemplary embodiments of the invention can, of course, be modified in various respects without departing from the basic idea. In particular, the invention is not limited to the specific shape of the perforation needles and of the guide in the housing. Other shapes can also be provided. In the exemplary embodiment shown in FIG. 4, a plurality of individual devices arranged beside one another, for example in the manner of a comb, can be combined to form units, which would be particularly useful where a substantially predetermined number of cable leads are regularly to be contacted with one another or with other cable leads and so on.

Further, in accordance with the exemplary embodiment shown in FIGS. 5 to 7, instead of the diametrically arranged clamping jaws, other radially compressible parts can also be arranged between housing and plunger, for example two mutually opposing scissor rods.

Combinations of the above-described exemplary embodiments are possible; in particular, it is possible also in the construction shown in FIG. 5 for at least two pressing elements, two holders and two perforation needles to be arranged inside a common housing, and so on.

We claim:

1. A device for making an electrically conductive contact to one or more insulated cable leads, comprising: (a) a holder for the or each of the cable leads which is to be contacted; (b) an electrically conductive perforation needle for the or each of the cable leads which is to be contacted, for penetrating the insulating jacket of the or each of the leads, wherein the or each perforation needle is guided in a generally elongate housing, one end of which comprises the holder for the cable lead, and is loaded by a biasing means in the direction of penetration into the insulating jacket of the cable lead; and (c) a substantially hollow cylindrical pressing element which can be moved relative to the housing and relative to the perforation needle which is loaded by a further biasing means in the direction of pressing into the cable lead, wherein the or each perforation needle and the or each pressing element is guided in the housing and is loaded by the biasing means in such a manner that, upon releasing these parts of the device in the direction of the or each inserted cable lead, first the or each pressing element, and thereafter the or each perforation needle is moved in the direction of forward thrust.

2. A device according to claim 1, wherein the perforation needle is loaded by a spring in the direction of penetration into the insulating jacket of the cable lead.

3. A device according to claim 1, wherein one end of the housing is a free end, the free end comprising the holder, and being conical or pyramid-shaped in the region of the holder.

4. A device according to claim 1, wherein the or each pressing element is loaded by a further spring in the direction of pressing onto the cable lead.

5. A device according to claim 3, wherein the housing is equipped, at the end remote from the free end, with a central pressure rod on which there is displaceably guided, inside the housing, a return grip to the central shaft of which, the or each perforation needle is operationally connected, the central shaft of the return grip being guided centrally in the housing.

6. A device according to claim 1, comprising an indicator unit, which indicates when contact has taken place between the perforation needle and the conductor of the or each cable lead.

7. A device according to claim 1, characterised in that at least two pressing elements two holders and two perforation needles are arranged inside a common housing.

8. A device according to claim 7, characterised in that the two holders for two cable leads are offset one behind the other in the longitudinal direction of the housing.

9. A device according to claim 7, characterised in that the two pressing elements are loaded by compression springs which are assigned individually, whilst the two perforation needles are acted upon by a spring which loads a common pressure rod.

10. A device for making an electrically conductive contact to one or more insulated cable leads, comprising (a) a holder for the or each of the cable leads which is to be contacted and (b) an electrically conductive perforation needle for the or each of the cable leads which is to contacted, for penetrating the insulating jacket of the or each of the leads, wherein the or each perforation needle is guided in a generally elongate housing, one end of which comprises the holder for the cable lead, wherein the housing is provided, at the end thereof remote from the holder with radially compressible parts the actuation of which effect axial displacement of a plunger which carries the or each perforation needle and of one or more pressing elements surrounding the plunger, in the direction of the cable lead which is to be acted upon.

11. A device according to claim 10, wherein the radially compressible parts are formed by two clamping jaws arranged diametrically on the housing and having conical clamping faces on the plunger to effect axial displacement of the latter.

12. A device according to claim 10, wherein the plunger which is connected to the perforation needle and is arranged slidably with respect to the pressing element is provided with an axially extending connection for a contact cable.

13. A device according to claim 10, wherein the plunger has a cylindrical sleeve between which and the central part of the plunger the pressing element is arranged so as to be axially displaceable within limits.

14. A device according to claim 13, characterised in that a helical compression spring is arranged between an annular shoulder of the housing and an outwardly pointing annular shoulder of the cylindrical sleeve.

15. A device according to claim 13, characterised in that a further spring, constructed as a helical compression spring, is arranged between an annular shoulder of the pressing element.

16. A device according to claim 10, wherein a third spring is arranged between the plunger and the perforation needle which spring exerts on the cable lead which is to be contacted a perforation force that is dependent only on its strength.

* * * * *